United States Patent
Joo et al.

(10) Patent No.: US 8,445,927 B2
(45) Date of Patent: May 21, 2013

(54) LIGHT EMITTING DIODE PACKAGE AND MANUFACTURING METHOD THEREOF

(75) Inventors: Seong Ah Joo, Gyeonggi-do (KR); Chang Hoon Kwak, Seoul (KR); Na Na Park, Seoul (KR); Il Woo Park, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 155 days.

(21) Appl. No.: 12/360,250

(22) Filed: Jan. 27, 2009

(65) Prior Publication Data

US 2010/0127290 A1    May 27, 2010

(30) Foreign Application Priority Data

Nov. 25, 2008   (KR) .................. 10-2008-0117310

(51) Int. Cl.
*H01L 21/50* (2006.01)
(52) U.S. Cl.
USPC .......................................................... 257/98
(58) Field of Classification Search
USPC ............ 257/100, 433–434, 787–796; 438/15, 438/25, 26, 51, 55, 64–67, 112, 124, 126, 438/127
See application file for complete search history.

(56) References Cited

U.S. PATENT DOCUMENTS

| | | | |
|---|---|---|---|
| 6,260,417 B1 * | 7/2001 | Watanabe et al. ................ | 73/754 |
| 6,515,355 B1 * | 2/2003 | Yin et al. ....................... | 257/678 |
| 6,531,328 B1 | 3/2003 | Chen | |
| 6,545,350 B2 * | 4/2003 | Ho et al. ........................ | 257/706 |
| 6,733,880 B2 * | 5/2004 | Tanabe et al. ............ | 428/355 R |
| 6,847,104 B2 | 1/2005 | Huang et al. | |
| 6,864,554 B2 * | 3/2005 | Lin et al. ........................ | 257/434 |
| 7,479,662 B2 * | 1/2009 | Soules et al. ..................... | 257/98 |
| 2002/0158578 A1 | 10/2002 | Eliashevich et al. | |
| 2004/0097006 A1 | 5/2004 | Lowery | |
| 2004/0173810 A1 * | 9/2004 | Lin et al. ........................ | 257/100 |
| 2006/0244120 A1 * | 11/2006 | Gospodinova-Daltcheva et al. ............................. | 257/690 |
| 2008/0006837 A1 | 1/2008 | Park et al. | |
| 2008/0128665 A1 | 6/2008 | Wu et al. | |
| 2009/0087953 A1 * | 4/2009 | Lin ................................ | 438/123 |

FOREIGN PATENT DOCUMENTS

KR      10-2007-0055814       5/2007

OTHER PUBLICATIONS

United States Office Action issued in U.S. Appl. No. 12/785,024, mailed Feb. 24, 2011.
US Office Action issued in U.S. Appl. No. 12/785,024, dated Aug. 3, 2011.
United States Office Action, issued in U.S. Appl. No. 12/785,024, dated Dec. 22, 2011.
United States Office Action issued in U.S. Appl. No. 12/785,025, mailed Dec. 22, 2011.
US Office Action issued in U.S. Appl. No. 12/785,024 dated Jun. 6, 2012.

* cited by examiner

*Primary Examiner* — Marcos D. Pizarro
*Assistant Examiner* — Sue Tang
(74) *Attorney, Agent, or Firm* — McDermott Will & Emery LLP

(57) ABSTRACT

The present invention relates to a light emitting diode package and a manufacturing method thereof.
The light emitting diode package includes a substrate, an LED chip mounted on an upper part of a substrate, a molding material coated at the upper part of the substrate including an external surface of the LED chip, and an encapsulant coated at a lower part of the substrate and can improve luminous efficiency, minimize a package failure, and reduce a manufacture cost by facilitating the manufacturing process.

9 Claims, 4 Drawing Sheets

LIGHT EMITTING DIODE PACKAGE AND MANUFACTURING METHOD THEREOF

CROSS-REFERENCE TO RELATED APPLICATIONS

This application claims the benefit of Korean Patent Application No. 10-2008-0117310 filed with the Korea Intellectual Property Office on Nov. 25, 2008, the disclosure of which is incorporated herein by reference.

BACKGROUND OF THE INVENTION

1. Field of the Invention

The present invention relates to a light emitting diode package and a manufacturing method thereof; and, more particularly, to a light emitting diode package capable of improving luminous efficiency by directly coating a surface of a light emitting diode device (hereinafter referred to as 'LED chip') with a fluorescent material and a manufacturing method thereof.

2. Description of the Related Art

An LED (Light Emitting Diode) is a semiconductor device capable of implementing multicolored light by constructing a light emitting source through a change of compound semiconductor material such as GaAs, AlGaAs, GaN and InGaInP.

Recently, due to rapid development of a semiconductor technology, the LED can be produced with high brightness and high quality in comparison with a general-purpose product with low brightness. Further, as blue and white LEDs with an excellent characteristic have been implemented, an application range of the LED has been broadened to a display, a next-generation illumination source, and so on.

Such an LED is mainly manufactured in a package type and an LED package includes a package mold having a molding material filling space by being coupled to a pair of lead frames, an LED chip mounted on the lead frames positioned inside the package mold, a wire for electrically connecting the LED chip and the lead frames, and a molding material for protecting the LED chip and a portion of the wire by being filled inside the package mold.

At this time, in the conventional LED package, the molding material can be made of light-transmitting resin mixed with a predetermined amount of fluorescent material in order to implement a white LED package.

Such a conventional LED package electrically connects the lead frames and the LED chip through the wire, wherein both ends of the wire are connected to power by being bonded to the lead frame and the LED chip respectively and one end of the wire of which the other end is bonded to a top surface of the LED chip is connected to the lead frame.

In other words, there is no option but to fill the molding material only by a dispensing method because the wire is positioned at an upper part of the LED chip mounted inside the package mold, thereby deteriorating workability.

Further, if a mixture of silicon and fluorescent material is injected inside the package mold for white light-emitting of the LED chip at the same time when the LED chip mounted inside the package mold is fixed and sealed, the fluorescent material is exposed outside the package mold through the wire, which causes a package failure.

And, a problem has been pointed out that luminous efficiency is reduced because the fluorescent material for white light-emitting of the package is coated only on a surface of the LED chip.

SUMMARY OF THE INVENTION

The present invention has been proposed in order to overcome the above-described problems and it is, therefore, an object of the present invention to provide a light emitting diode package which is coated with a fluorescent material to be in contact with a surface of an LED chip mounted at an upper part of a lead frame and encapsulated at a lower part of the lead frame by using an encapsulant including a reflection material.

Further, it is another object of the present invention to provide a light emitting diode package not to contact a fluorescent material for white light-emitting of an LED chip with a wire by implementing electric connection between the LED chip and a lead frame through the wire on a bottom surface of the lead frame mounting the LED chip.

In accordance with one aspect of the present invention to achieve the object, there is provided a light emitting diode package including: a substrate; an LED chip mounted on an upper part of a substrate; a molding material coated at the upper part of the substrate including an external surface of the LED chip; and an encapsulant coated at a lower part of the substrate.

At this time, the substrate and the LED chip are electrically connected by being bonded with wires and the wires electrically connect a bottom surface of the substrate and a bottom surface of the LED chip.

Therefore, since a substrate mounted surface and a wire-bonded surface of the LED chip are formed on the same surface, a fluorescent material coated at an upper part of the LED chip is not in contact with the wires.

Further, the encapsulant coated at the lower part of the substrate can be made of transparent resin and light emitted from the LED chip is reflected at the encapsulant by including a reflection material in the transparent resin and can be emitted through the fluorescent material of the upper part.

At this time, it is preferable that the substrate is made of light-transmitting material in order to reflect light emitted from the LED chip through the encapsulant including the reflection material.

Further, the molding material covers a top surface of the LED chip and all sides of lateral parts of the LED chip by being coated at the upper part of the substrate and is made of resin including the fluorescent material, wherein it is preferable that the resin is formed by mixing the fluorescent material and the silicon at a predetermined ratio.

And, a reflection layer can be formed on a top surface of the substrate or the external surface of the LED chip and can be formed on both the substrate and the LED chip.

Meanwhile, in accordance with another aspect of the present invention to achieve the object, there is provided a manufacturing method of a light emitting diode package including the steps of: forming through holes on a flat-panel type substrate at equal intervals; mounting LED chips at upper parts of the through holes to cover the through holes of the substrate; bonding the LED chips and the substrate with wires; coating a top surface of the substrate with a molding material to cover all sides and top surfaces of the LED chips; coating a bottom surface of the substrate with an encapsulant to encompass the bonded wires; and after curing the molding material and the encapsulant, cutting the light emitting diode package into unit light emitting diode packages along dicing lines.

It is preferable that the substrate includes a plurality of through holes at equal intervals and the through holes are formed in sizes to be covered by the LED chips.

The molding material coated on an upper part of the substrate is entirely coated in order to bury the LED chips mounted at the upper part of each of the through holes of the substrate and is made of resin mixed with a yellow, red or green fluorescent material.

Further, the encapsulant is coated on the bottom surface of the substrate to bury the wires electrically connected by being bonded to the LED chip and is made of transparent resin or resin including a reflection material.

The molding material and the encapsulant can be coated at predetermined thicknesses by any one of coating methods such as squeeze, screen printing, silk screen, and stencil.

At this time, in the light emitting diode package, the molding material and the encapsulant can be coated by a dispensing method and when the molding material and the encapsulant are coated by the dispensing method, the light emitting diode package can be manufactured by dispensing the molding material and the encapsulant to the upper and lower parts of the substrate after manufacturing an individual package.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 2 to 7 are views showing a manufacturing method of a light emitting diode package in accordance with the present invention;

FIG. 4 is a cross-sectional view illustrating a case in which the substrate and the LED chips employed in the light emitting diode package in accordance with the present embodiment are bonded with wires;

FIG. 5 is a cross-sectional view illustrating a case in which a molding material is coated during the manufacturing method of the light emitting diode package in accordance with the present embodiment;

FIG. 6 is a cross-sectional view illustrating a case in which an encapsulant is coated during the manufacturing method of the light emitting diode package in accordance with the present embodiment; and FIG. 7 is a cross-sectional view illustrating a cutting process during the manufacturing method of the light emitting diode package in accordance with the present embodiment.

DETAILED DESCRIPTION OF THE PREFERABLE EMBODIMENTS

A matter regarding to an operation effect including a technical configuration for the objects of a light emitting diode package and a manufacturing method thereof in accordance with the present invention will be clearly appreciated through the following detailed description with reference to the accompanying drawings illustrating preferable embodiments of the present invention.

Structure of Light Emitting Diode Package

Figure 1:
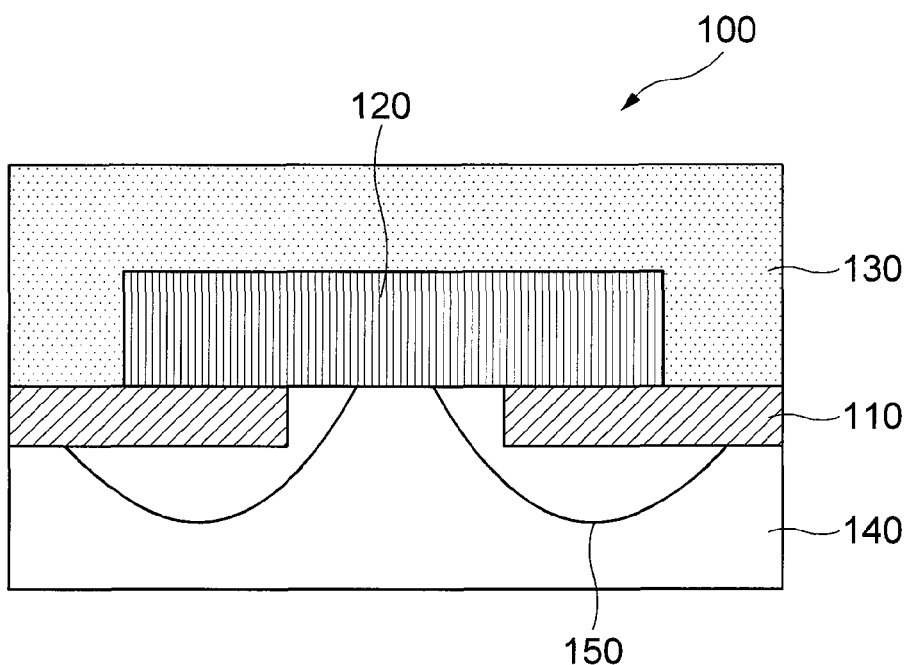
FIG. 1 is a cross-sectional view illustrating a light emitting diode package in accordance with one embodiment of the present invention.

At first, FIG. 1 is a cross-sectional view illustrating a light emitting diode package in accordance with one embodiment of the present invention.

As shown in the drawing, in accordance with the embodiment of the present invention, the light emitting diode package 100 includes a substrate 110, an LED (Light Emitting Diode) chip 120 mounted on the substrate 110, and a molding material 130 and an encapsulant 140 coated at upper and lower parts of the substrate 110 at predetermined thicknesses.

The substrate 110 is formed in a flat-plane shape with a through hole 111 (see FIG. 2) at a central part and the LED chip 120 is mounted on a circumferential part inside the substrate 110 including the through hole 111.

A bottom surface of the LED chip 120 is supported to a top surface of the substrate 110 and at this time, the LED chip 120 and the substrate 110 are electrically connected through wires 150.

The wires 150 electrically connect the LED chip 120 and the substrate 110 by bonding one ends of the wires 150 to the bottom surface of the LED chip 120 and bonding the other ends thereof to a bottom surface of the substrate 110 and the wires 150 of which the one ends are coupled to the bottom surface 120 of the LED chip 120 mounted on the substrate 110, are drawn out and so the other ends thereof are coupled to the bottom surface of the substrate 110.

In other words, as the bottom surface of the LED chip 120 is received on the top surface of the substrate 110 and the one ends of the wires 150 are bonded inside a substrate-received surface of the LED chip 120, support and wire-bonding of the LED chip 120 are implemented on the bottom surface of the LED chip 120 as the same surface as the substrate-received surface.

Further, the molding material 130 is coated on the top surface of the substrate 110 mounting the LED chip 120. The molding material 130 is coated at an upper part of the substrate 110 at a predetermined height, wherein it is preferable that it is coated at the height higher than the LED chip 120 in order to bury the LED chip 120 mounted on the substrate 110.

The molding material 130 is coated on the substrate 110 by being mixed with a fluorescent material for emitting light from the LED chip 120 as white light and silicon resin for fixing the LED chip 120.

When the molding material 130 is coated on the top surface of the substrate 110, it is directly in contact with the top surface of the LED chip 120 and all sides exposed to lateral parts thereof in order to improve luminous efficiency when the light emitted from the LED chip 120 is emitted through the fluorescent material of the molding material 130.

Further, the molding material 130 can be formed by mixing the silicon resin with a yellow, red or green fluorescent material and the various colors of the fluorescent material and a light-emitting color of the LED chip 120 are combined in order to emit the light emitted through the molding material 130 mixed with the fluorescent material as the white light.

For instance, in case that the LED chip 120 mounted on the substrate 110 is an LED chip 120 which emits blue light, the white light can be emitted by using resin which is mixed with the red fluorescent material or the green fluorescent material.

At this time, the fluorescent material can employ any one of a silicate based fluorescent material, an oxide based fluorescent material, a nitride based fluorescent material, and an oxy-nitride based fluorescent material.

Meanwhile, the encapsulant 140 which is mainly made of transparent resin is coated on the bottom surface of the substrate 110 coated with the molding material 130.

The encapsulant 140 is formed to protect the wires coupled for electrical connection between the substrate 110 and the LED chip 120 and the bottom surfaces of the LED chip 120 and the substrate 110 and it is coated on the bottom surface of the substrate 110 at a height at which the wires can be buried.

It is preferable that the encapsulant 140 is made of transparent resin or resin including the reflection material.

In case that the encapsulant 140 is made of the resin including the reflection material, the light emitted from the LED chip 120 mounted on the substrate 110 is reflected at the reflection material inside the encapsulant 140 and emitted outside through the molding material 130 including the fluorescent material of the upper part, thereby enhancing luminous efficiency of the LED chip 120.

At this time, it is preferable that the substrate 110 on which the molding material 130 and the encapsulant 140 are separately coated is made of light-transmitting material with relatively high light-transmissivity so that the light emitted from the LED chip 120 can be easily reflected at the encapsulant 140 including the reflection material.

Meanwhile, a reflection layer can be formed on the bottom surfaces of the substrate 110 and the LED chip 120 and the reflection layer can be formed on both the substrate 110 and the LED chip 120.

Manufacturing Method of Light Emitting Diode Package

FIGS. 2 to 7 are views showing a manufacturing method of a light emitting diode package in accordance with the present invention.

Figure 2A:
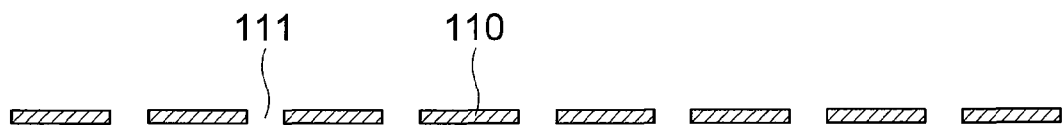
FIGS. 2A and 2B are a perspective view and a cross-sectional view showing a substrate employed during the manufacturing method of the light emitting diode package in accordance with the present embodiment.
Figure 2B:
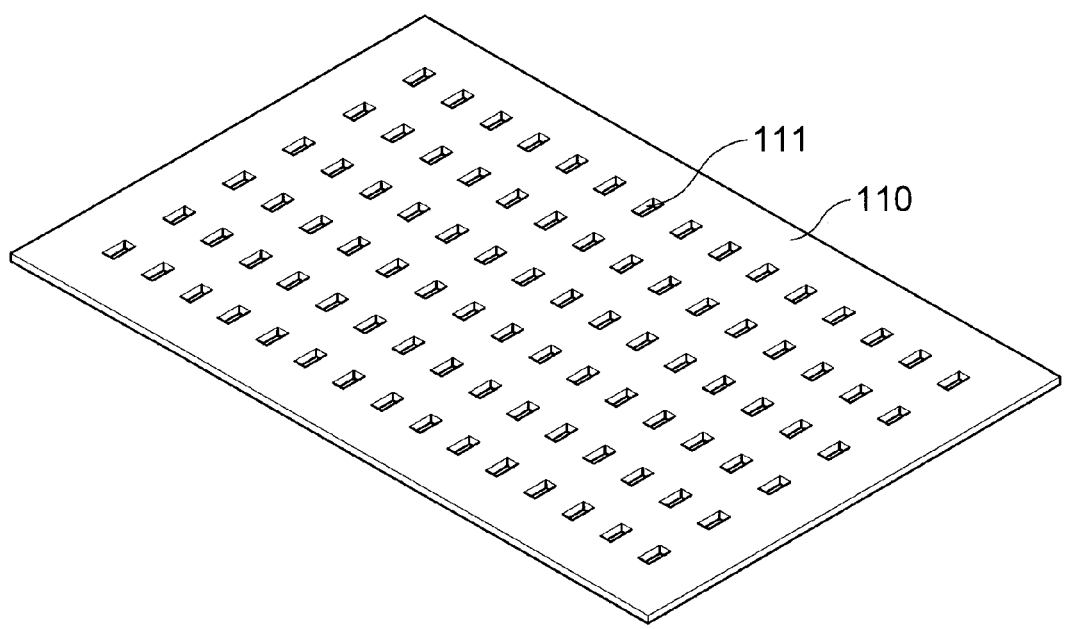

FIGS. 2A and 2B are a perspective view and a cross-sectional view showing a substrate employed during the manufacturing method of the light emitting diode package in accordance with the present embodiment. As shown in the drawings, at first, the flat panel type substrate 110 is prepared and a plurality of through holes 111 are formed on the substrate 110 at equal intervals.

Figure 3A:
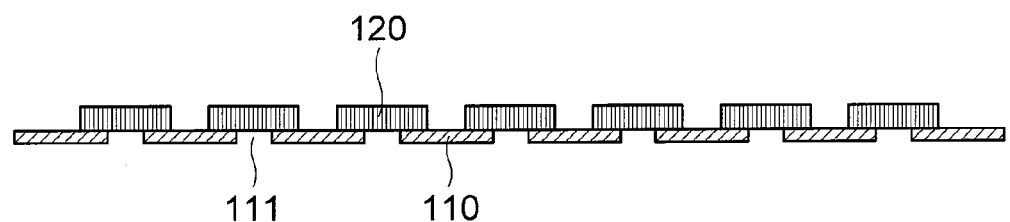
FIGS. 3A and 3B are a perspective view and a cross-sectional view showing a state in which LED chips are mounted to the substrate employed during the manufacturing method of the light emitting diode package in accordance with the present embodiment.
Figure 3B:
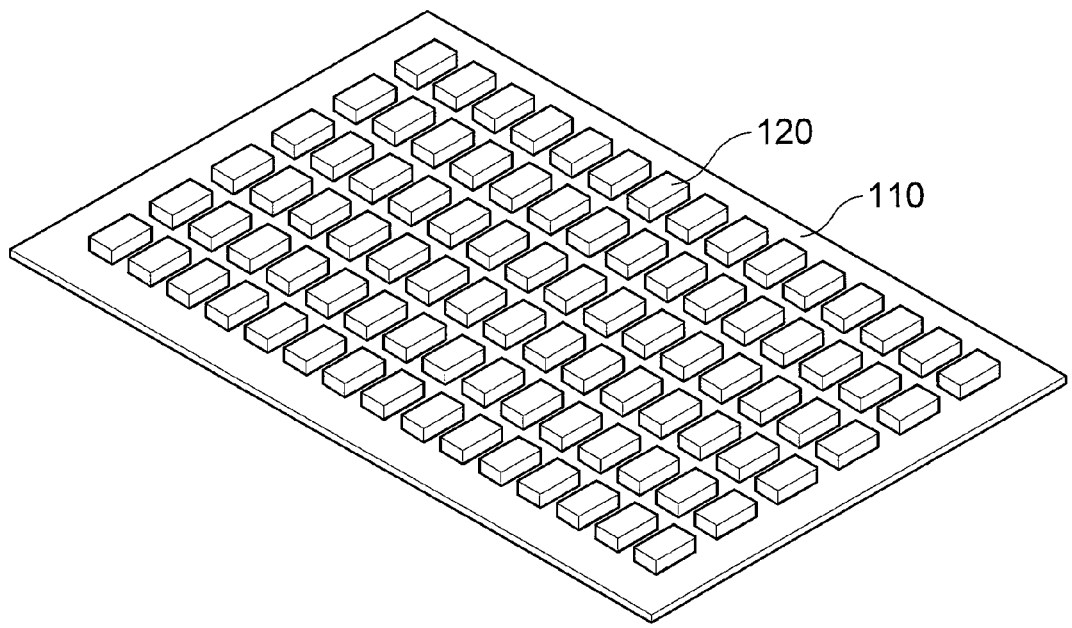

FIGS. 3A and 3B are a perspective view and a cross-sectional view showing a state in which LED chips are mounted on the substrate employed during the manufacturing method of the light emitting diode package in accordance with the present embodiment. As shown in the drawings, a plurality of LED chips 120 are mounted on a top surface of the substrate 110 including the through holes 111 in order to cover the through holes 111.

Figure 4:
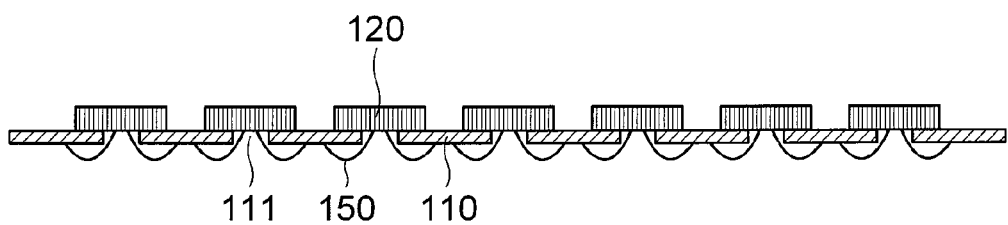

The LED chips 120 are individually received on circumferential parts inside the substrate 110, i.e., the top surface of the substrate 110 outside the through holes 111 which are formed on the substrate 110 by being coupled to the through holes 111 one to one Then, FIG. 4 is a cross-sectional view illustrating a case in which the substrate and the LED chips employed in the light emitting diode package in accordance with the present embodiment are bonded with wires. In the present embodiment, the substrate 110 and the LED chips 120 are electrically connected to each other by being bonded through the wires 150.

As the wires 150 are bonded to bottom surfaces of the substrate 110 and the LED chip 120 in order to electrically connect both the members, substrate-received surfaces and wire-bonded surfaces of the LED chips 120 can be formed on the same surface.

Figure 5:
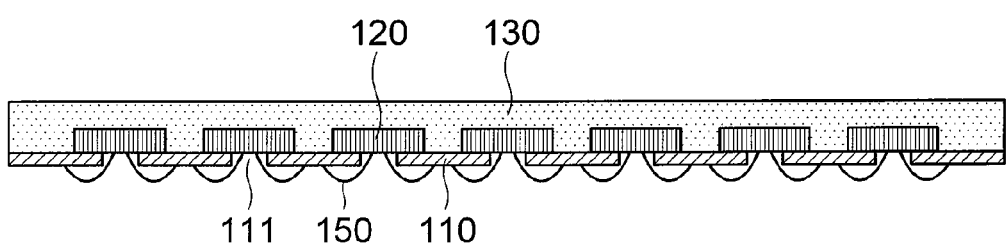

Further, FIG. 5 is a cross-sectional view illustrating a case in which a molding material is coated during the manufacturing method of the light emitting diode package in accordance with the present embodiment. As shown in the drawing, the molding material 130 is coated at an upper part of the substrate 110 at a predetermined thickness after mounting the LED chips 120 on the top surface of the substrate 110 and bonding the substrate 110 and the LED chips 120 through the wires 150.

The molding material 130 is made of resin mixed with a fluorescent material and silicon and the mixed fluorescent material in the molding material 130 can be a blue, red or green fluorescent material.

At this time, it is preferable that the molding material 130 is formed at the thickness at which the LED chips 120 received on the substrate 110 can be buried.

Further, since light emitted from the LED chips 120 is reflected at a bottom surface of the substrate 110 or the bottom surfaces of the LED chips 120 and emitted upward through the molding material 130 mixed with the fluorescent material, luminous efficiency of the LED chips 120 can be improved.

Figure 6:
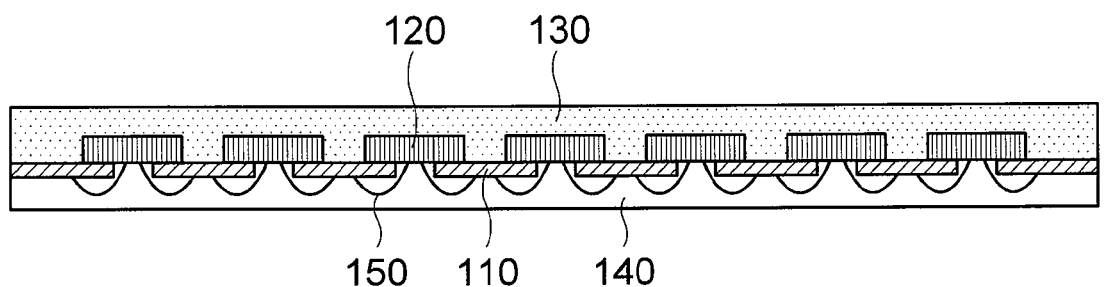

Then, FIG. 6 is a cross-sectional view illustrating a case in which an encapsulant is coated during the manufacturing method of the light emitting diode package in accordance with the present embodiment. As shown in the drawing, after coating the top surface of the substrate 110 with the molding material 130 mixed with the fluorescent material, the encapsulant 140 is coated on the bottom surface of the substrate 110 at a predetermined thickness.

It is preferable that the encapsulant 140 is formed on the bottom surface of the substrate 110 at the thickness at which the wires 150 can be sufficiently buried in order to protect the bonded wires 150 to electrically connect the substrate 110 and the LED chips 120.

Further, although the encapsulant 140 is mainly made of transparent resin, it can be made of resin mixed with a reflection material in order to improve the luminous efficiency of the LED chips 120.

At this time, the reason why the encapsulant 140 is made of the resin mixed with the reflection material is to improve luminous efficiency of the light emitting diode package by totally reflecting the light emitted from the LED chips 120 to the reflection material of the encapsulant 140 positioned at a lower part and emitting the light upward through the molding material 130 wrapping the LED chips 120.

Meanwhile, the molding material 130 and the encapsulant 140 can be coated on upper and lower parts of the substrate 110 by a coating method such as squeeze, screen printing, silk screen, and stencil.

Meanwhile, the molding material 130 and the encapsulant 140 can be coated on upper and lower surfaces of the substrate 110 at a predetermined thickness by a dispensing method. At this time, in case that the molding material 130 and the encapsulant 140 are formed by the dispensing method, after the substrate 110 with one through hole 111 is individually formed firstly and the LED chip 120 is individually mounted on the substrate 110, the molding material 130 and the encapsulant 140 are formed at the upper and lower parts of the substrate 110 through dispensing.

Therefore, in case that the molding material 130 and the encapsulant 140 are formed by the dispensing method, the following cutting process for a unit package can be omitted in manufacturing the light emitting diode package of the present embodiment.

Figure 7:
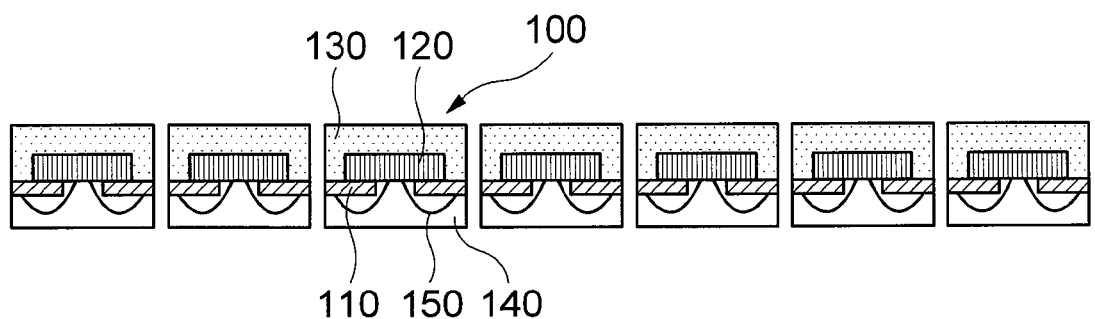

Lastly, FIG. 7 is a cross-sectional view illustrating a cutting process during the manufacturing method of the light emitting diode package in accordance with the present embodiment and as shown in the drawing, after curing the molding material 130 and the encapsulant 140 coated with respect to the substrate 110, the light emitting diode package is cut along dicing lines in order to manufacture unit light emitting diode packages.

As described above, the light emitting diode package and the manufacturing method thereof of the present invention can improve the luminous efficiency by directly contacting the molding material mixed with the fluorescent material with the external surface of the LED chip to form the molding material at the predetermined thickness and by reflecting the light emitted from the LED chip at the encapsulant including the reflection material.

Further, the present invention can reduce a package failure caused when the fluorescent material spreads along the wires by preventing the wires for electrical connection between the substrate and the LED chip from being directly in contact with the fluorescent material by bonding the wires to the lower part of the LED chip and reduce a manufacture cost by facilitating the manufacturing method.

As described above, although the preferable embodiments of the present invention have been shown and described, it will be appreciated by those skilled in the art that substitutions, modifications and changes may be made in these embodiments without departing from the principles and spirit of the general inventive concept, the scope of which is defined in the appended claims and their equivalents.

What is claimed is:

1. A light emitting diode package, comprising:
    a substrate formed of a light-transmitting material and having a through hole formed therein;
    an LED (Light Emitting Diode) chip mounted on an upper part of the through hole of the substrate, the LED chip emitting light when an electrical signal is applied thereto;
    a molding material coated on an upper part of the substrate including an external surface of the LED chip; and
    an encapsulant coated on a lower part of the substrate, the encapsulant including a resin and a reflective material distributed in the resin, wherein:
    the substrate and the LED chip are electrically connected by bonding one ends of wires to a bottom surface of the LED chip and bonding the other ends of the wires drawn from a wire-bonded surface of the LED chip to a bottom surface of the substrate, the wires are formed through the through hole,
    side surfaces of the coated molding material, side surfaces of the substrate and side surfaces of the coated encapsulant are substantially coplanar,
    the substantially coplanar surfaces form outer surfaces of the LED package,
    the molding material is made of resin mixed with a fluorescent material, is molded around the LED chip mounted on the substrate to be directly in contact with a top surface of the LED chip and side surfaces of the LED chip, and is coated with a predetermined thickness thereon,
    the molding material has a wave-length conversion feature, the encapsulant has a reflectivity feature, and the substrate has a transparency feature, and
    the molding material and the encapsulant, having different optical features including wave-length conversion and reflectivity, from each other, are not directly in contact with each other and are separated by the substrate having the transparency feature.

2. The light emitting diode package of claim 1, wherein the through hole is formed at a central part of the substrate and the LED chip is received at an upper part of the through hole to cover the through hole.

3. The light emitting diode package of claim 2, wherein the through hole is formed in a size to be covered by the LED chip mounted on the substrate and a bottom surface of the LED chip is received at a circumferential part inside the substrate including the through hole.

4. The light emitting diode package of claim 1, wherein the fluorescent material is any one of a blue, red or green fluorescent material.

5. The light emitting diode package of claim 1, further comprising:
    a plurality of wires formed through the through hole, wherein each of the plurality of wires has one end bonded to a bottom surface of the LED chip, and the other end drawn from a wire-bonded surface of the LED chip bonded to bottom surface of the substrate.

6. The light emitting diode package of claim 1, wherein the coated encapsulant encompasses the bonded wires.

7. The light emitting diode package of claim 1, wherein the coated encapsulant covers the entirety of the bottom surface of the substrate.

8. The light emitting diode package of claim 7, wherein the coated encapsulant encompasses the bonded wires.

9. The light emitting diode package of claim 1, wherein the substantially coplanar surfaces include the side surfaces of the molding material, the side surfaces of the substrate and the side surfaces of the encapsulant, in this order in a direction of thickness of the substrate.

* * * * *